(12) United States Patent
Weber

(10) Patent No.: US 11,262,250 B2
(45) Date of Patent: Mar. 1, 2022

(54) METHOD FOR MEASURING A TEMPERATURE

(71) Applicant: Applied Materials, Inc., Santa Clara, CA (US)

(72) Inventor: Heiko Weber, Dresden (DE)

(73) Assignee: Applied Materials, Inc., Santa Clara, CA (US)

( * ) Notice: Subject to any disclaimer, the term of this patent is extended or adjusted under 35 U.S.C. 154(b) by 477 days.

(21) Appl. No.: 16/271,336

(22) Filed: Feb. 8, 2019

(65) Prior Publication Data

US 2019/0265110 A1   Aug. 29, 2019

Related U.S. Application Data

(60) Provisional application No. 62/636,765, filed on Feb. 28, 2018.

(51) Int. Cl.
*G01K 15/00* (2006.01)
*G01K 7/18* (2006.01)
*H01L 21/67* (2006.01)

(52) U.S. Cl.
CPC .......... *G01K 7/183* (2013.01); *G01K 7/186* (2013.01); *G01K 15/005* (2013.01); *H01L 21/67103* (2013.01); *H01L 21/67248* (2013.01)

(58) Field of Classification Search
CPC combination set(s) only.
See application file for complete search history.

(56) References Cited

U.S. PATENT DOCUMENTS

| 4,419,021 | A | | 12/1983 | Terada et al. |
| 4,891,499 | A | | 1/1990 | Moslehi |
| 4,952,904 | A | * | 8/1990 | Johnson ................ G01F 1/6845 257/757 |
| 5,775,811 | A | | 7/1998 | Hiraoka et al. |
| 5,848,842 | A | | 12/1998 | Peuse et al. |

(Continued)

FOREIGN PATENT DOCUMENTS

KR   10-1057853 B1   8/2011

OTHER PUBLICATIONS

Office Action from Taiwan Patent Application No. 108106283 dated Nov. 22, 2019.

(Continued)

*Primary Examiner* — Lisa M Caputo
*Assistant Examiner* — Nasir U. Ahmed
(74) *Attorney, Agent, or Firm* — Patterson + Sheridan, LLP

(57) ABSTRACT

Implementations described herein generally relate to semiconductor manufacturing, and more specifically to a temperature measurement device. In one implementation, the temperature measurement device includes a substrate and a stack of metal layers coupled to the substrate. Each metal layer of the stack of metal layers extends continuously uninterrupted from edge to edge of the substrate. The first metal layer has a lower electrical resistivity than the second metal layers. The electrical resistivity of the stack is based on the electrical resistivity of the first metal layer, which is temperature dependent. Utilizing a known relationship between temperature measurements and resistivity measurements, the temperature measurement device can measure and store temperature information in various substrate processing processes.

20 Claims, 2 Drawing Sheets

(56) References Cited

U.S. PATENT DOCUMENTS

| | | | | |
|---|---|---|---|---|
| 6,022,749 | A | * | 2/2000 | Davis .................... G01K 7/186 |
| | | | | 136/236.1 |
| 6,081,182 | A | | 6/2000 | Tomozawa et al. |
| 6,241,146 | B1 | | 6/2001 | Wienand et al. |
| 7,141,992 | B2 | | 11/2006 | Ohno et al. |
| RE43,660 | E | | 9/2012 | Sakuma et al. |
| 8,730,002 | B2 | | 5/2014 | Wienand et al. |
| 8,871,363 | B2 | | 10/2014 | Tsuchiya et al. |
| 9,200,968 | B2 | | 12/2015 | Coln et al. |
| 2012/0201271 | A1 | * | 8/2012 | Timans ................ G01K 11/125 |
| | | | | 374/161 |
| 2013/0125644 | A1 | * | 5/2013 | Pernod .................... G01P 5/12 |
| | | | | 73/204.27 |
| 2014/0146856 | A1 | * | 5/2014 | Tian ........................ G01K 7/16 |
| | | | | 374/185 |
| 2016/0163965 | A1 | | 6/2016 | Han et al. |
| 2017/0052161 | A1 | * | 2/2017 | Liu .................... G01N 33/0027 |

OTHER PUBLICATIONS

PCT Notification of Transmittal of the International Search Report and the Written Opinion of the International Searching Authority for International Application No. PCT/US2019/017368; dated Jun. 17, 2019; 13 total pages.

Office Action from Taiwan Patent Application No. 108106283 dated Jul. 29, 2020.

* cited by examiner

METHOD FOR MEASURING A TEMPERATURE

CROSS-REFERENCE TO RELATED APPLICATIONS

This application claims priority to U.S. Provisional Patent Application Ser. No. 62/636,765, filed on Feb. 28, 2018, which is incorporated herein by reference.

BACKGROUND

Field

Implementations described herein generally relate to semiconductor manufacturing, and more specifically to a temperature measuring device.

Description of the Related Art

Semiconductor devices are commonly fabricated by a series of processes in which layers are deposited on a surface of a substrate and the deposited material is etched into desired patterns. As semiconductor device geometries decrease, precise process control during these processes becomes more and more important.

Temperature control is particularly important to achieve repeatable semiconductor manufacture with improved yield and high throughput in process chambers, such as deposition or etch chambers, for semiconductor processing. This is because precise manufacturing techniques have small process window, and even slight excursions out of acceptable process control tolerances can lead to catastrophic amounts of production defects.

Conventionally, temperature information of a substrate is typically obtained by either sensors installed on the process chamber, such as pyrometer, or temperature measuring substrates having on-board electronic temperature sensors. However, these temperature measuring devices or methods are limited to certain processes or require installed hardware.

Therefore, there is a need for an improved device for measuring substrate temperature.

SUMMARY

Implementations described herein generally relate to semiconductor manufacturing, and more specifically to a temperature measuring device. In one implementation, a temperature measuring device includes a substrate including a first side and a second side opposite the first side. The substrate is configured to replicate a workpiece used in vacuum processing. The temperature measuring device further includes a stack extends substantially across the first side of the substrate from edge to edge. The stack includes a first metal layer having a first material and two second metal layers each having a second material different than the first material. The first metal layer is disposed between the two second metal layers.

In another implementation, a temperature measuring device includes a substrate including a first side and a second side opposite the first side. The substrate is configured to replicate a workpiece used in vacuum processing. The temperature measuring device further includes a stack extends substantially across the first side of the substrate from edge to edge. The stack includes a first metal layer having a first electrical resistivity and two second metal layers each having a second electrical resistivity greater than the first electrical resistivity. The first metal layer is disposed between the two second metal layers.

In another implementation, a method for measuring a temperature includes placing a first temperature measuring device into a process chamber, perform a process on the first temperature measuring device, measuring a sheet resistivity of the first temperature measuring device, and converting the sheet resistivity to a temperature.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, and may admit to other equally effective implementations.

Figure 1:
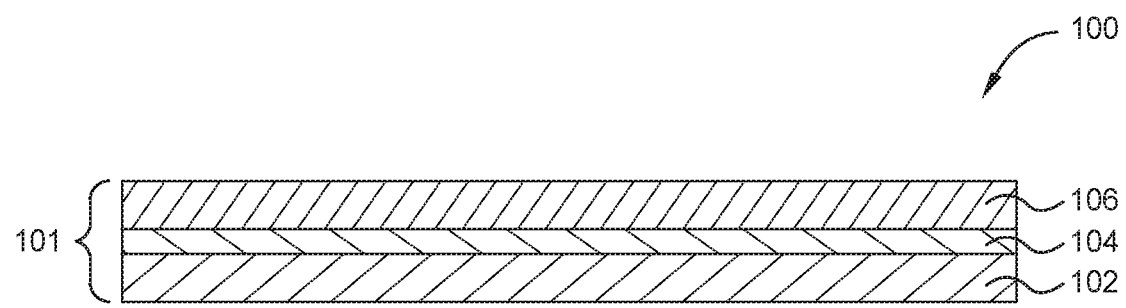
FIG. 1 illustrates a schematic cross-sectional side view of a temperature measuring device.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Implementations described herein generally relate to semiconductor manufacturing, and more specifically to a temperature measuring device. In one implementation, which can include or be combined with one or more implementations described herein, the temperature measuring device includes a substrate and a stack of metal layers coupled to the substrate. Each metal layer of the stack of metal layers extends continuously uninterrupted from edge to edge of the substrate. The stack of metal layers includes a first metal layer fabricated from a first material disposed between two second metal layers fabricated from a second material that is different from the first material. The first metal layer has a lower electrical resistivity than the second metal layers. The electrical resistivity of the stack is based on the electrical resistivity of the first metal layer, which is temperature dependent. Utilizing a known relationship between temperature measurements and resistivity measurements, the temperature measuring device can measure and store temperature information in various substrate processing processes.

FIG. 1 illustrates a schematic cross-sectional side view of a temperature measuring device 100. The temperature measuring device 100 includes a stack 101 of metal layers. The stack 101 includes a first metal layer 104 disposed between two second metal layers 102, 106. The first metal layer 104 is fabricated from a first material, and the second metal layers 102, 106 are fabricated from a second material different from the first material. For example, the first metal layer 104 may be fabricated from aluminum, tungsten, silver, or other suitable metal, and the two second metal layers 102, 106 may be fabricated from titanium or other suitable metal. The first metal layer 104 has a thickness ranging from about 5 nanometers (nm) to about 10 nm, and the second metal layers 102, 106 each have a thickness ranging from about 10 nm to about 20 nm.

The first metal layer 104 has a lower electrical resistivity than the second metal layers 102, 106, so the sheet resistivity of the temperature measuring device 100 is based on the resistivity of the first metal layer 104 due to the dominant electrical current path through the first metal layer 104. The first metal layer 104 acts as a high conductive channel of the temperature measuring device 100. At elevated temperatures, such as from about 200 degrees Celsius to about 1000 degrees Celsius, atoms in the second metal layers 102, 106 diffuse into the first metal layer 104. When the temperature is not uniform across the temperature measuring device 100, the amount of diffused atoms locally varies across the temperature measuring device 100 following the temperature variation. The diffusion of the atoms from the second metal layers 102, 106 into the first metal layer 104 locally increases the resistivity of the first metal layer 104, which in turn locally increases the sheet resistivity of the temperature measuring device 100. Furthermore, the amount of diffusion is temperature dependent because the diffusion coefficient is a function of temperature. Thus, when separate regions of the temperature measuring device 100 are at different temperatures, the amount of diffusion at each region is different, and the change in resistivity of the first metal layer 104 in each region is different. By plotting changes in sheet resistivity versus temperatures, a relationship between the sheet resistivity of the temperature measuring device 100 and the corresponding temperatures of the temperature measuring device 100 can be identified. In one example, the relationship is a linear relationship, such as $y=ax+b$, where y is the sheet resistivity of the temperature measuring device 100 or the change in sheet resistivity of the temperature measuring device 100 compared to the baseline sheet resistivity, x is the temperature, and a and b are constants. With this relationship (i.e., a and b constants are known), the highest temperature that the temperature measuring device 100 has experienced can be calculated if the sheet resistivity or a change in sheet resistivity of the temperature measuring device 100 is known or can be measured.

The temperature measuring device 100 can be fabricated and used as follows. The metal layers 102, 104, 106 may be fabricated by a physical vapor deposition (PVD) process at room temperature, such as from about 20 degrees Celsius to about 25 degrees Celsius. After the temperature measuring device 100 is fabricated, the sheet resistivity of the temperature measuring device 100 is measured to obtain a baseline sheet resistivity that corresponds to a highest temperature that the temperature measuring device 100 has so far experienced. In one example, the baseline sheet resistivity corresponds to the temperature the temperature measuring device 100 experienced during the fabrication of the temperature measuring device 100. In another example, the baseline sheet resistivity corresponds to the temperature the temperature measuring device 100 that is slightly higher than the fabrication temperature. In other words, for example, the temperature measuring device 100 is fabricated at about 25 degrees Celsius, and the temperature measuring device 100 is heated to about 30 degrees Celsius. The sheet resistivity of the temperature measuring device 100 corresponds to about 30 degrees Celsius.

A calibration is then performed on the temperature measuring device 100. The calibration is performed by heating the temperature measuring device 100 to multiple temperatures, such as from about 200 degrees Celsius to about 1000 degrees Celsius at an increment from about 10 degrees Celsius to about 100 degrees Celsius. After each time the temperature measuring device 100 is being heated, a corresponding sheet resistivity of the temperature measuring device 100 is measured. During the calibration, a corresponding sheet resistivity of the temperature measuring device 100 for each temperature of the multiple temperatures that the temperature measuring device 100 is being heated to is identified and recorded. A relationship between the sheet resistivity of the temperature measuring device 100 and the corresponding temperatures of the temperature measuring device 100 can be calculated based on the data obtained from the calibration of the temperature measuring device 100. For example, sheet resistivity (or change in sheet resistivity) versus temperature can be plotted using the measured sheet resistivity and the corresponding temperatures obtained during the calibration, and a regression analysis is performed to establish a regression model that identifies the relationship between the sheet resistivity of the temperature measuring device 100 and the corresponding temperatures of the temperature measuring device 100. In some implementations, the relationship is between changes in sheet resistivity compared to the baseline sheet resistivity and the corresponding temperatures. The relationship, such as a linear relationship, for example, $y=ax+b$, can be calculated based on the data obtained from the calibration of the temperature measuring device 100. Specifically, the data obtained from the calibration process help identify the constants in the relationship, for example, constants a and b in $y=ax+b$.

Because the diffusion of the atoms from the second metal layers 102, 106 into the first metal layer 104 is irreversible, the calibrated temperature measuring device 100 is no longer able to show a change in sheet resistivity within the calibration temperature range. A newly fabricated temperature measuring device 100 having identical size and shape of the calibrated temperature measuring device 100 can be used to measure a temperature that the newly fabricated temperature measuring device 100 is experiencing. The temperature that the newly fabricated temperature measuring device 100 intends to measure is greater than the highest temperature that the newly fabricated temperature measuring device 100 has experienced. Prior to measuring a temperature, the baseline sheet resistivity of the newly fabricated temperature measuring device 100 is obtained either by measuring the sheet resistivity of the temperature measuring device 100 or by heating the temperature measuring device 100 to a temperature slightly higher than the fabricating temperature and then measuring the sheet resistivity of the temperature measuring device 100.

Because the newly fabricated temperature measuring device 100 has the identical size and shape as the calibrated temperature measuring device 100, the relationship calculated for the calibrated temperature measuring device 100 can be applied to the newly fabricated temperature measuring device 100. For example, the relationship $y=ax+b$, where constants a and b are determined from the calibration process, can be used on the newly fabricated temperature measuring device 100 that does not go through the calibration process.

To measure a temperature indicating of a production temperature, the newly fabricated temperature measuring device 100 is placed in a process environment, such as a process chamber, and a process, such as a deposition or etch process, is performed. The newly fabricated temperature measuring device 100 is then removed from the process environment, and the sheet resistivity of the newly fabricated temperature measuring device 100 is measured. The sheet resistivity of the newly fabricated temperature measuring device 100 can be measured by any suitable method. In one example, a probe, such as a four-point probe having four probes equally spaced from each other, is in contact with the newly fabricated temperature measuring device 100 at one location to measure the sheet resistivity of the newly fabricated temperature measuring device 100 at that particular location. The probe may be moved to other locations of the newly fabricated temperature measuring device 100 to measure the local sheet resistivity. The measured sheet resistivity is used to calculate the highest temperature that the newly fabricated temperature measuring device 100 is experienced during the process based on the relationship calculated for the calibrated temperature measuring device 100. In one example, the relationship is y=ax+b, where a and b are known constants. By plugging the measured sheet resistivity as y, the highest temperature that the newly fabricated temperature measuring device 100 has experienced during the process, which is x, can be calculated. A thermal profile of the newly fabricated temperature measuring device 100 can be created by converting the local sheet resistivity to temperatures.

Figure 2A:
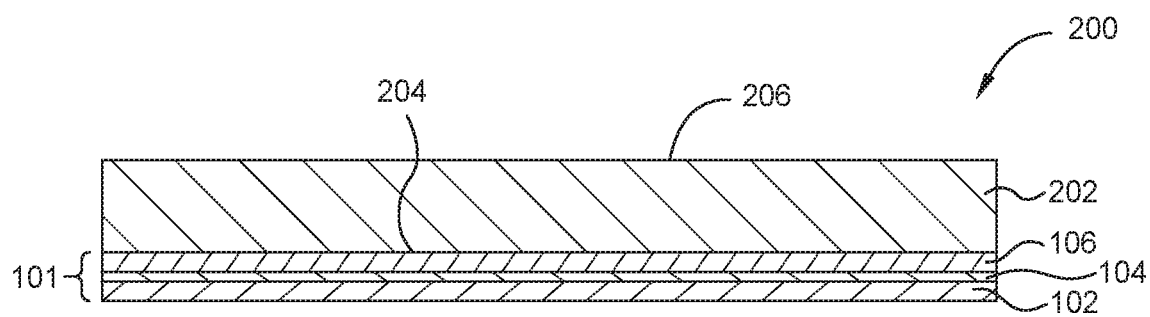
FIGS. 2A-2C illustrate schematic cross-sectional side views of a temperature measuring device including a substrate and a stack of metal layers.
Figure 2B:
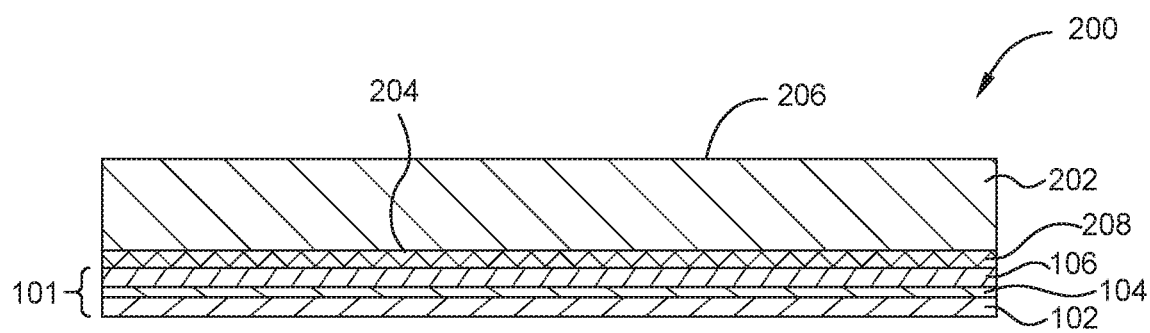
Figure 2C:
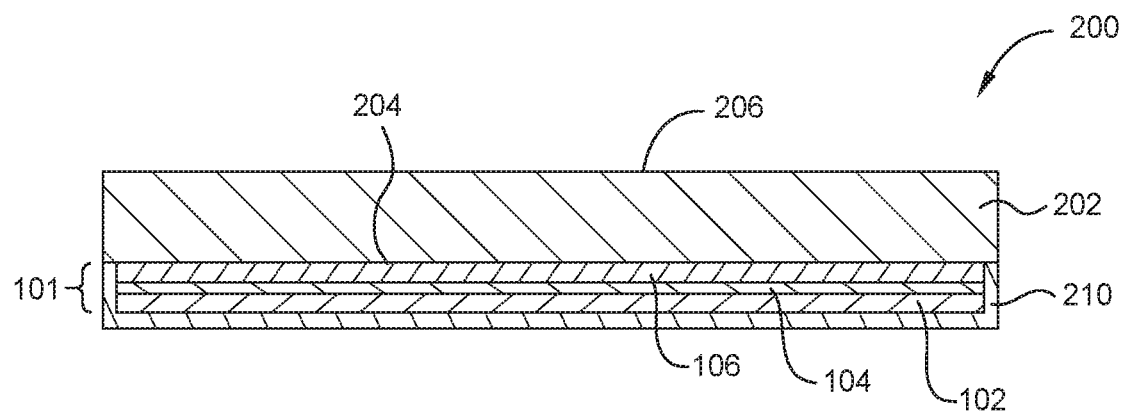

FIGS. 2A-2C illustrate schematic cross-sectional side views of a temperature measuring device 200 including a substrate 202 and the stack 101. As shown in FIG. 2A, the temperature measuring device 200 may be the stack 101 directly coupled to a first side 204 of the substrate 202. The substrate 202 may be fabricated from a semiconductor, such as silicon, germanium, silicon germanium, group III/V compound semiconductors, for example GaAs or InGaAs, or other semiconductor material. In display or solar technology, the substrate 202 may be fabricated from glass or polymer. In one implementation, the substrate 202 is fabricated from a semiconductor, glass, or a polymer. The substrate 202 may be circular, rectangular, or other suitable shape. The substrate 202 is configured to replicate a workpiece used in vacuum processing, such as a semiconductor workpiece in integrated circuit or light emitting diode (LED) applications or a glass workpiece in solar or display applications. For example, the substrate 202 generally has the shape and size that imitates the shape and size of a production workpiece that is processed in the vacuum processing chamber to fabricate a solar cell, flat panel, integrated circuit and the like, and thus, is sized to be robotically through the vacuum processing chamber slit valve door and sit on a substrate support just like the production workpiece. In one example, the substrate 202 has a diameter of 200 mm, 300 mm, or 450 mm. In another example, the substrate 202 is rectangular and has an area of about 12000 to about 91000 cm$^2$. The substrate 202 includes a second side 206 opposite the first side 204. The stack 101 includes the first metal layer 104 and the second metal layers 102, 106, and the stack 101 may be formed on the substrate 202 using a PVD process at a process temperature ranging from about 20 degrees Celsius to about 25 degrees Celsius. The stack 101 or the three metal layers 102, 104, 106, extends across the first side 204 of the substrate 202 from edge to edge, as shown in FIG. 2A. Thus, the stack 101 covers 100 percent of the first side 204 of the substrate 202. The stack 101 has the same shape as the substrate 202 and has a dimension, such as a diameter, that is the same as the dimension of the substrate 202. In one example, the substrate 202 is circular and has a diameter of about 300 mm, and the stack 101 is circular and has a diameter of about 300 mm.

The temperature measuring device 200 may be used to troubleshoot a process, such as a deposition or etch process, that produces defects, such as non-uniform thickness profile of a deposited layer by a deposition process or non-uniform depths in a plurality of openings formed by an etch process. The temperature measuring device 200 is placed into the process chamber in which the process is performed, and the process is performed on the side 206 of the substrate 202 of the temperature measuring device 200. The process conditions are the same as the process conditions during the actual process. After the process is performed on the temperature measuring device 200, such as forming a layer on the side 206 of the substrate 202 or forming a plurality of openings on the side 206 of the substrate 202, the temperature measuring device 200 is removed from the process chamber and the sheet resistivity at one or more locations on the stack 101 of the temperature measuring device 200 is measured. In one example, sheet resistivity measurements were measured at 10 to 100 locations on the stack 101. The measured sheet resistivity were converted to temperatures using the relationship identified by the calibration, and a thermal profile of the stack 101 (or substrate 202) can be mapped from the temperatures. The relationship identified by the calibration is obtained by calibrating a temperature measuring device 200 using the calibration method described above. The calibrated temperature measuring device 200 is not operable to measure any temperatures within the calibration range. The temperature measuring device 200 used to measure a temperature has the same size and shape as the calibrated temperature measuring device 200. The thermal profile can identify any hot or cold spots that may be the cause of the defects. In one example, the hot spot is caused by residual deposition on the surface of the substrate support.

FIG. 2B is a schematic cross-sectional side view of the temperature measuring device 200 according to another implementation. As shown in FIG. 2B, the temperature measuring device 200 includes a layer 208 disposed between the substrate 202 and the stack 101. The layer 208 is in contact with the side 204 of the substrate 202 and the metal layer 106 of the stack 101. The layer 208 may improve the adhesion of the stack 101 to the substrate 202. The layer 208 may also reduce damage to the substrate 202 during reclaim process. The layer 208 may be fabricated from a dielectric material, such as an oxide, for example silicon oxide. The layer 208 has a thickness of a few nanometers to micrometers. During the reclaim process, the stack 101 may be removed by a chemical mechanical polishing (CMP) process, and the substrate 202 is protected by the layer 208 from the CMP process. The layer 208 can be removed from the substrate 202 by a wet etch process or other suitable process.

FIG. 2C is a schematic cross-sectional side view of the temperature measuring device 200 according to another implementation. As shown in FIG. 2B, the temperature measuring device 200 includes a passivation layer 210 surrounding the stack 101. The passivation layer 210 is in contact with a portion of the side 204 of the substrate 202 and the stack 101. The passivation layer 210 has a thickness of a few Angstroms to 50 Angstroms. The passivation layer 210 encapsulates the stack 101, which minimizes any metal contamination. The passivation layer 210 may be fabricated from a dielectric material, such as an oxide, for example silicon oxide. As shown in FIG. 2C, the stack 101, or the three metal layers 102, 104, 106, extends substantially across the first side 204 of the substrate 202 from edge to edge. The stack 101 covers greater than 95 percent of the first side 204 of the substrate 202.

Figure 3:
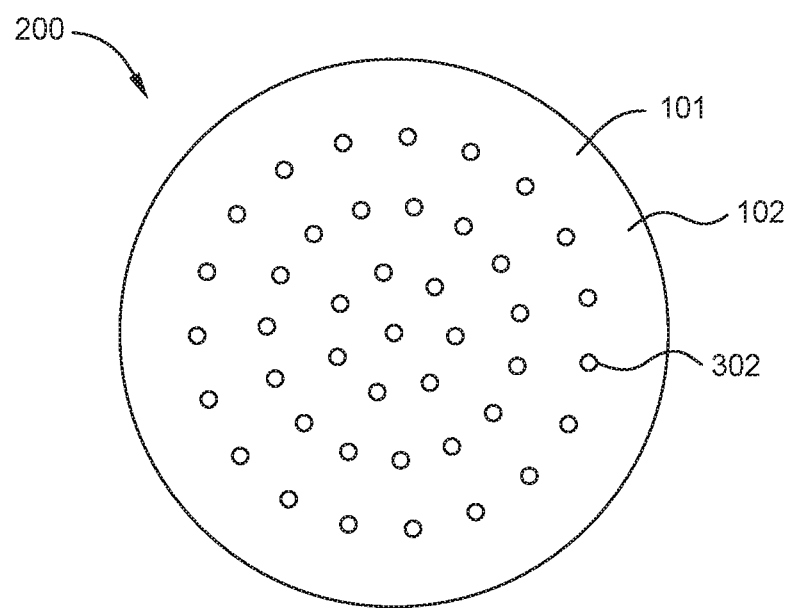
FIG. 3 illustrates a bottom view of the temperature measuring device of FIGS. 2A-2C.

FIG. 3 illustrates a bottom view of the temperature measuring device 200. As shown in FIG. 3, a plurality of measurement locations 302 is located on the metal layer 102 of the stack 101. The number and pattern of the measurement locations 302 may be depend on the process. In one example, the number of measurement locations 302 ranges from about 10 to about 100. In one example, the measurement locations 302 form a pattern having concentric circles. Sheet resistivity measured at the measurement locations 302 may be different due to different amount of atoms diffused from the second metal layers 102, 106 into the first metal layer 104 at different measurement locations 302.

The temperature measuring device including a stack having a plurality of metal layers is utilized to measure the highest temperature the temperature measuring device has experienced. Because the relationship between sheet resistivity (or a change in sheet resistivity) and the experienced temperature is identified by a calibration process, the temperature measuring device provides a cheap, easy to prepare, and wide applicable method to measure a temperature in any semiconductor or display processes. Furthermore, the temperature measuring device can provide local sheet resistivity information, so a thermal profile of the temperature measuring device can be mapped to identify any hot or cold spots.

While the foregoing is directed to implementations of the present disclosure, other and further implementations of the disclosure may be devised without departing from the basic scope thereof, and the scope thereof is determined by the claims that follow.

What is claimed is:

1. A temperature measuring device, comprising:
   a substrate including a first side and a second side opposite the first side the first side and second side meeting at an edge circumscribing the first side and second side, the substrate configured to replicate a workpiece used in vacuum processing; and
   a stack extending substantially across the first side of the substrate to the edge, the stack comprising:
      a first metal layer comprising a first material; and
      two second metal layers each comprising a second material different than the first material, the first metal layer being disposed between the two second metal layers wherein the second metal layers are configured to diffuse atoms into the first metal layer at elevated temperatures.

2. The temperature measuring device of claim 1, wherein the first material comprises aluminum, tungsten, or silver.

3. The temperature measuring device of claim 2, wherein the second material comprises titanium.

4. The temperature measuring device of claim 1, wherein the stack is in direct contact with the substrate.

5. The temperature measuring device of claim 1, further comprising a layer disposed between the substrate and the stack.

6. The temperature of claim 5, wherein the layer comprises a dielectric material.

7. The temperature measuring device of claim 1, further comprising a passivation layer encapsulating the stack.

8. The temperature measuring device of claim 7, wherein the passivation layer comprises a dielectric material.

9. The temperature measuring device of claim 1, wherein the substrate comprises semiconductor, glass, or polymer.

10. A temperature measuring device, comprising:
    a substrate including a first side and a second side opposite the first side, the first side and second side meeting at an edge circumscribing the first side and second side, the substrate configured to replicate a workpiece used in vacuum processing; and
    a stack extending substantially across the first side of the substrate to the edge, the stack comprising:
       a first metal layer having a first electrical resistivity; and
       two second metal layers each having a second electrical resistivity greater than the first electrical resistivity, the first metal layer being disposed between the two second metal layers wherein the second metal layers are configured to diffuse atoms into the first metal layer to permanently change the electrical resistivity of the first metal layer.

11. The temperature measuring device of claim 10, wherein the first material comprises aluminum, tungsten, or silver.

12. The temperature measuring device of claim 11, wherein the second material comprises titanium.

13. The temperature measuring device of claim 10, wherein the stack is in direct contact with the substrate.

14. The temperature measuring device of claim 10, further comprising a layer disposed between the substrate and the stack.

15. The temperature measuring device of claim 10, further comprising a passivation layer encapsulating the stack.

16. A method for measuring a temperature, comprising:
    placing a first temperature measuring device into a process chamber, the first temperature measuring device extending from edge to edge of a substrate and having a first metal layer disposed between two second metal layers wherein the two second metal layers each having a second electrical resistivity greater than a first electrical resistivity of the first metal layer;
    perform a process on the first temperature measuring device;
    removing the first temperature measuring device from the process chamber;
    measuring a sheet resistivity of the first temperature measuring device; and
    converting the sheet resistivity to determine a temperature experienced in the process chamber.

17. The method of claim 16, wherein the converting the sheet resistivity to a temperature comprises using a regression model previously identified during a calibration process, the calibration process performed using a second temperature measuring device different than the first temperature measuring device.

18. The method of claim 17, wherein the calibration process comprises incrementally heating the second temperature measuring device to multiple temperatures.

19. The method of claim 18, wherein the calibration process further comprises measuring a sheet resistivity of the second temperature measuring device at each temperature of the multiple temperatures.

20. The method of claim 19, further comprising establishing the regression model using the multiple temperatures and the corresponding sheet resistivity.

* * * * *

UNITED STATES PATENT AND TRADEMARK OFFICE
CERTIFICATE OF CORRECTION

| | |
|---|---|
| PATENT NO. | : 11,262,250 B2 |
| APPLICATION NO. | : 16/271336 |
| DATED | : March 1, 2022 |
| INVENTOR(S) | : Heiko Weber |

It is certified that error appears in the above-identified patent and that said Letters Patent is hereby corrected as shown below:

In the Specification

Column 5, Line 56, delete "101 or" and insert -- 101, or --.

In the Claims

Column 7, Line 32, Claim 1, delete "the first side the first side" and insert -- the first side --.

Column 7, Line 55, Claim 6, after "temperature" insert -- measuring device --.

Signed and Sealed this
Tenth Day of May, 2022

Katherine Kelly Vidal
*Director of the United States Patent and Trademark Office*